US008527855B2

(12) United States Patent
Ghosh

(10) Patent No.: US 8,527,855 B2
(45) Date of Patent: Sep. 3, 2013

(54) INTERLEAVING AND PARSING FOR MIMO-OFDM SYSTEMS

(75) Inventor: Monisha Ghosh, Chappaqua, NY (US)

(73) Assignee: Koninklijke Philips N.V., Eindhoven (NL)

( * ) Notice: Subject to any disclaimer, the term of this patent is extended or adjusted under 35 U.S.C. 154(b) by 2309 days.

(21) Appl. No.: 11/203,593

(22) Filed: Aug. 12, 2005

(65) Prior Publication Data
US 2006/0036924 A1 Feb. 16, 2006

Related U.S. Application Data

(60) Provisional application No. 60/601,922, filed on Aug. 16, 2004, provisional application No. 60/624,235, filed on Nov. 2, 2004.

(51) Int. Cl.
H03M 13/03 (2006.01)
(52) U.S. Cl.
USPC ............................ 714/787; 714/788; 714/790
(58) Field of Classification Search
USPC ................................................ 714/787, 790
See application file for complete search history.

(56) References Cited

U.S. PATENT DOCUMENTS

| 5,305,353 | A | * | 4/1994 | Weerackody | 375/347 |
| 5,457,712 | A | * | 10/1995 | Weerackody | 375/347 |
| 5,812,601 | A | * | 9/1998 | Schramm | 375/262 |
| 5,825,807 | A | * | 10/1998 | Kumar | 375/130 |
| 5,881,058 | A | * | 3/1999 | Chen | 370/335 |
| 5,949,796 | A | * | 9/1999 | Kumar | 370/529 |
| 5,987,016 | A | * | 11/1999 | He | 370/335 |
| 6,246,698 | B1 | * | 6/2001 | Kumar | 370/487 |
| 6,278,685 | B1 | * | 8/2001 | Yonge et al. | 370/203 |
| 6,366,624 | B1 | * | 4/2002 | Balachandran et al. | 375/341 |
| 6,460,159 | B1 | * | 10/2002 | Kim et al. | 714/790 |
| 6,704,370 | B1 | * | 3/2004 | Chheda et al. | 375/299 |
| 6,898,198 | B1 | * | 5/2005 | Ryan et al. | 370/338 |
| 6,934,901 | B2 | * | 8/2005 | Dagan et al. | 714/747 |
| 6,956,814 | B1 | * | 10/2005 | Campanella | 370/210 |
| 6,961,388 | B2 | * | 11/2005 | Ling et al. | 375/267 |
| 7,020,073 | B2 | * | 3/2006 | Kadous et al. | 370/208 |
| 7,027,523 | B2 | * | 4/2006 | Jalali et al. | 375/296 |
| 7,031,251 | B2 | * | 4/2006 | Chen et al. | 370/208 |
| 7,072,413 | B2 | * | 7/2006 | Walton et al. | 375/267 |

(Continued)

OTHER PUBLICATIONS

The Authoritative Dictionary of IEEE Standards Terms, pp. 1-76.*

(Continued)

Primary Examiner — Joseph D Torres
(74) Attorney, Agent, or Firm — Larry Liberchuk

(57) ABSTRACT

A wireless bit-interleaved coded OFDM (BI-COFDM) multiple-in-multiple-out (MIMO) system that improves the diversity seen by a convolutional decoder. The bit stream is interleaved first, then bits are mapped into symbols and then symbols are parsed into $N_t$ separate streams, where t is the number of transmitters. A deinterleaver then performs the inverse permutation before sending the symbols to a Viturbi decoder. In another embodiment, a transmitting side bit-interleaver transforms an encoded and punctured bit stream using a first permutation, groups the transformed bit stream according to a desired constellation on one of $N_t$ antennae, splits the transformed bit stream into separate streams accordingly and bit-interleaves/symbol-maps using a plurality of bit-interleavers/symbol-mappers to permute each stream using a second permutation. A receiving side performs the inverse operations of the transmitting side.

7 Claims, 8 Drawing Sheets

(56) References Cited

U.S. PATENT DOCUMENTS

Figure 1A:
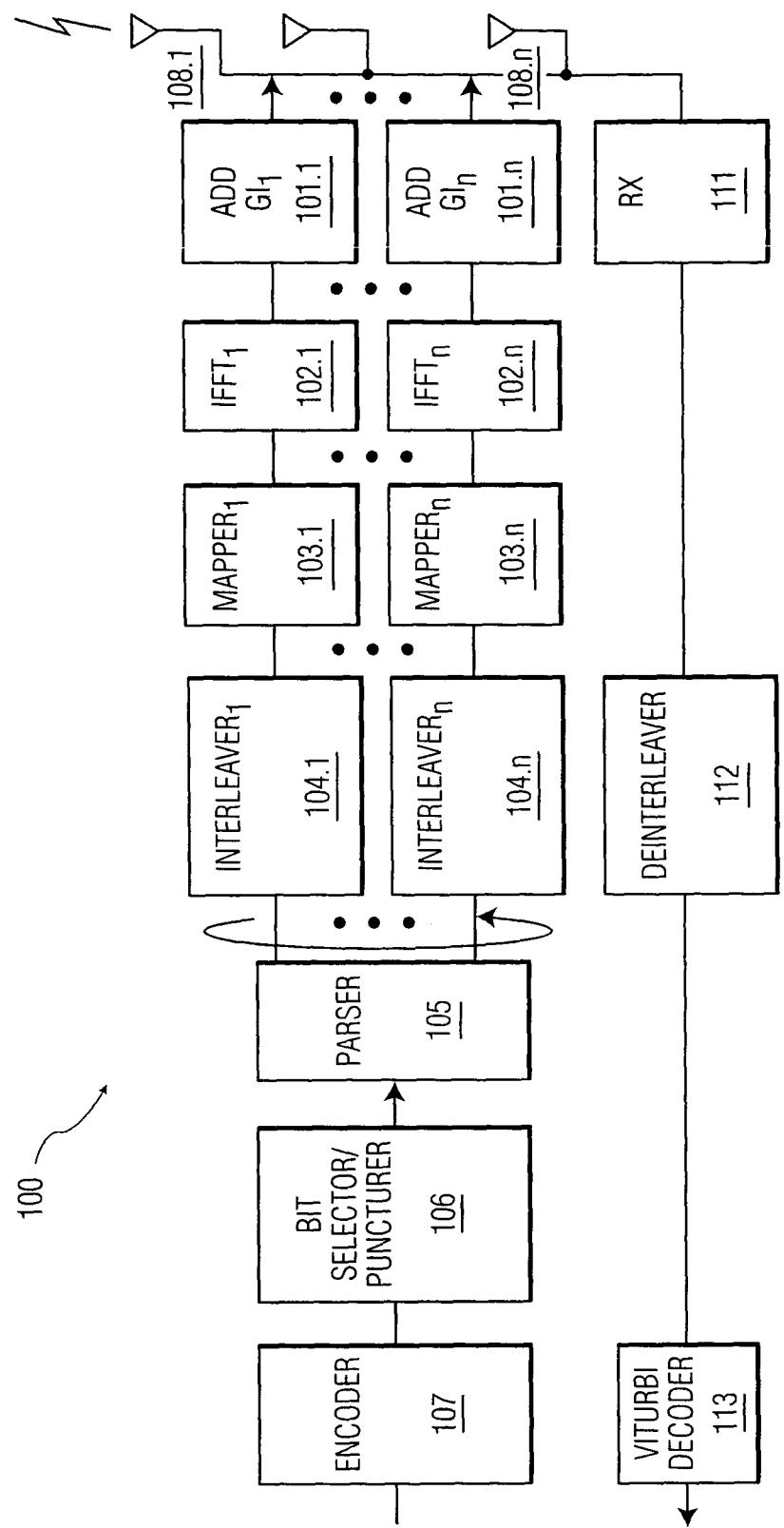

| | | | |
|---|---|---|---|
| 7,110,350 B2* | 9/2006 | Li et al. | 370/204 |
| 7,154,936 B2* | 12/2006 | Bjerke et al. | 375/148 |
| 7,233,612 B1* | 6/2007 | Zhang et al. | 375/130 |
| 7,333,560 B2* | 2/2008 | Jalali et al. | 375/296 |
| 7,346,135 B1* | 3/2008 | Narasimhan | 375/346 |
| 7,570,695 B2* | 8/2009 | Maltsev et al. | 375/260 |
| 2005/0180525 A1* | 8/2005 | Hansen et al. | 375/295 |

OTHER PUBLICATIONS

Ban, K., Katayama, M., Stark, W.E., Yamazato, T., Ogawa, A., Convolutionally Coded DS/CDMA System using Multi-Antenna Transmission, IEEE Global Telecommunications Conference—Communications : Changing the Way We Work and Play! -. 1997.*

Oh-Soon Shin, Kwang Bok, Antenna-Assisted Round Robin Scheduling for MIMO Cellular Systems, IEEE Communications Letters, vol. 7, No. 3, Mar. 2003, pp. 109-111.*

* cited by examiner

US 8,527,855 B2

INTERLEAVING AND PARSING FOR MIMO-OFDM SYSTEMS

CROSS REFERENCE TO RELATED APPLICATION

This application claims the benefit of U.S. Provisional Application Ser. No. 60/601,922 filed Aug. 16, 2004 and U.S. Provisional Application Ser. No. 60/624,235 filed Nov. 2, 2004 both of which are incorporated herein by reference.

The present invention relates to an apparatus, method and system for interleaving and parsing in a MIMO-OFDM based wireless multimedia communication system.

Wireless local area networks (WLAN) are increasingly important in meeting the needs of the next generation of broadband wireless communication systems for both commercial and military applications. In 1999, the Institute of the Electrical and Electronics Engineers (IEEE) 802.11a working group approved a standard for a 5 GHz band WLAN that supports a variable bit rate from 6 to 54 Mbps, and orthogonal frequency-division multiplexing (OFDM) was chosen because of its well-known ability to avoid multipath effects while achieving high data rates by combining a high order sub-carrier modulation with a high-rate convolutional code.

Multiple Input Multiple Output (MIMO) systems, by employing multiple transmit and receive antennas, are known to provide higher capacity and therefore higher throughput than single-link wireless communication systems. MIMO systems form the basis for wireless LANS, as a means to increase data rates in a robust fashion. Another widely used technique in wireless modems in bit-interleaved coded OFDM (BI-COFDM), is explained, for example, in the IEEE 802.11a/g standard. When using MIMO with BI-COFDM, the design of the interleaver and parser becomes very important.

The simplest way of mapping a data stream onto multiple antennae is to split the coded bit stream at the output of the convolutional coder in a round-robin fashion $N_t$ parallel bit-streams, where $N_t$ is the number of antennae. Each stream is then individually interleaved using, for example, an IEEE 802.11a interleaver. The size of the interleaver is determined by the number of bits that are mapped into a single OFDM symbol. The goal is to spread adjacent bits as far apart as possible so that they experience independent fading. When the parsing is done prior to interleaving, as described above, it is not guaranteed, however, that adjacent bits prior to parsing will be mapped to non-adjacent carriers on different antennae. Thus, the amount of frequency and spatial diversity is reduced.

The present invention provides an apparatus, system and method that interleaves first map bits into symbols and then parses symbols into $N_t$ separate streams. One advantage of the present invention is improved diversity as seen by a convolutional decoder.

In a preferred embodiment, the system and method of the present invention includes the following:

(1) a bit interleaver that interleaves over the total number of bits in one OFDM symbol over all $N_t$ antennae;
(2) a bit-to-symbol mapper that maps bits into symbols such that a plurality of different constellations on a plurality of different antennae can be supported; and
(3) a parser that sends the plurality of different symbols to the plurality of different antennae.

Figure 1B:
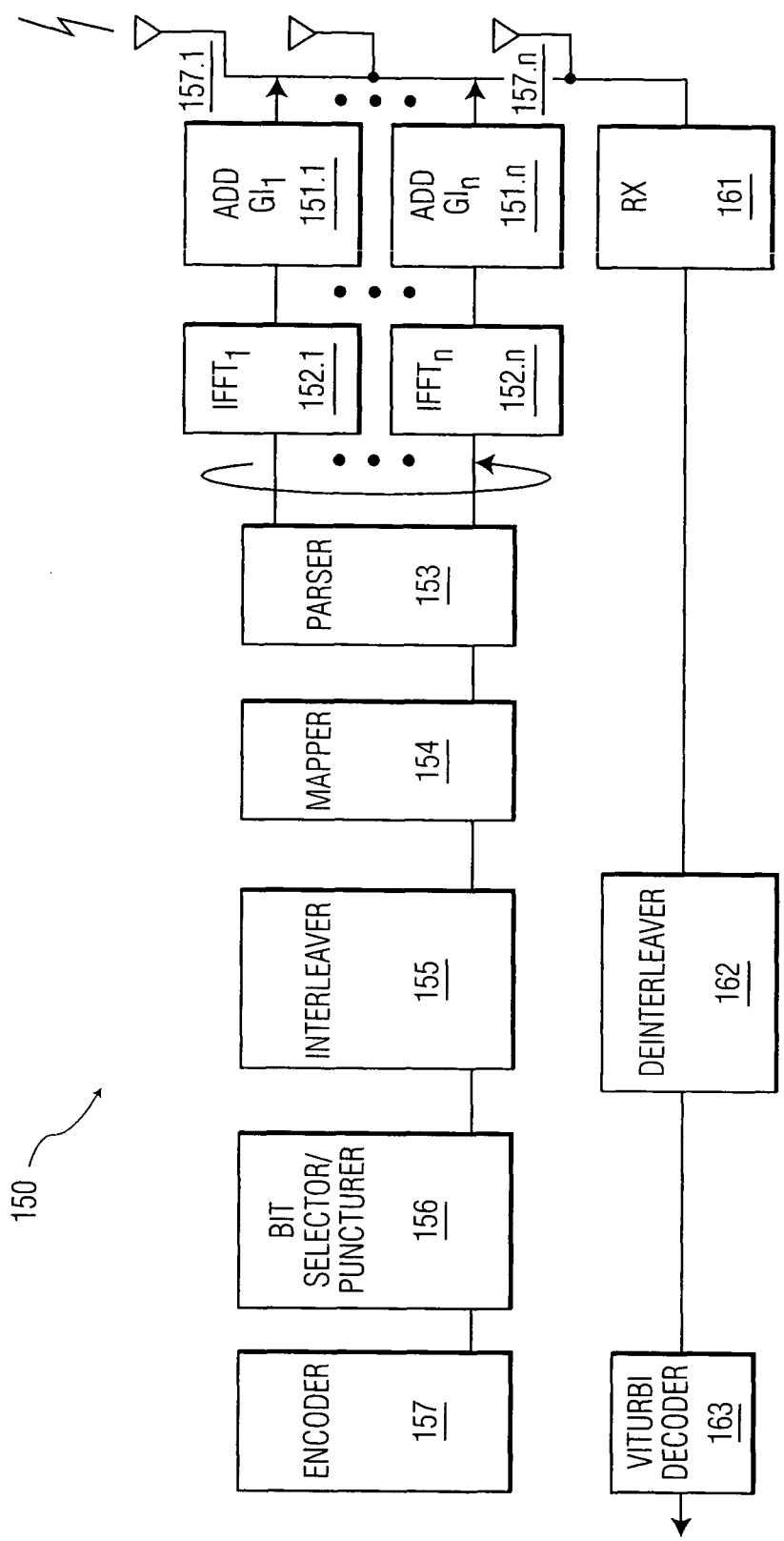
Figure 1C:
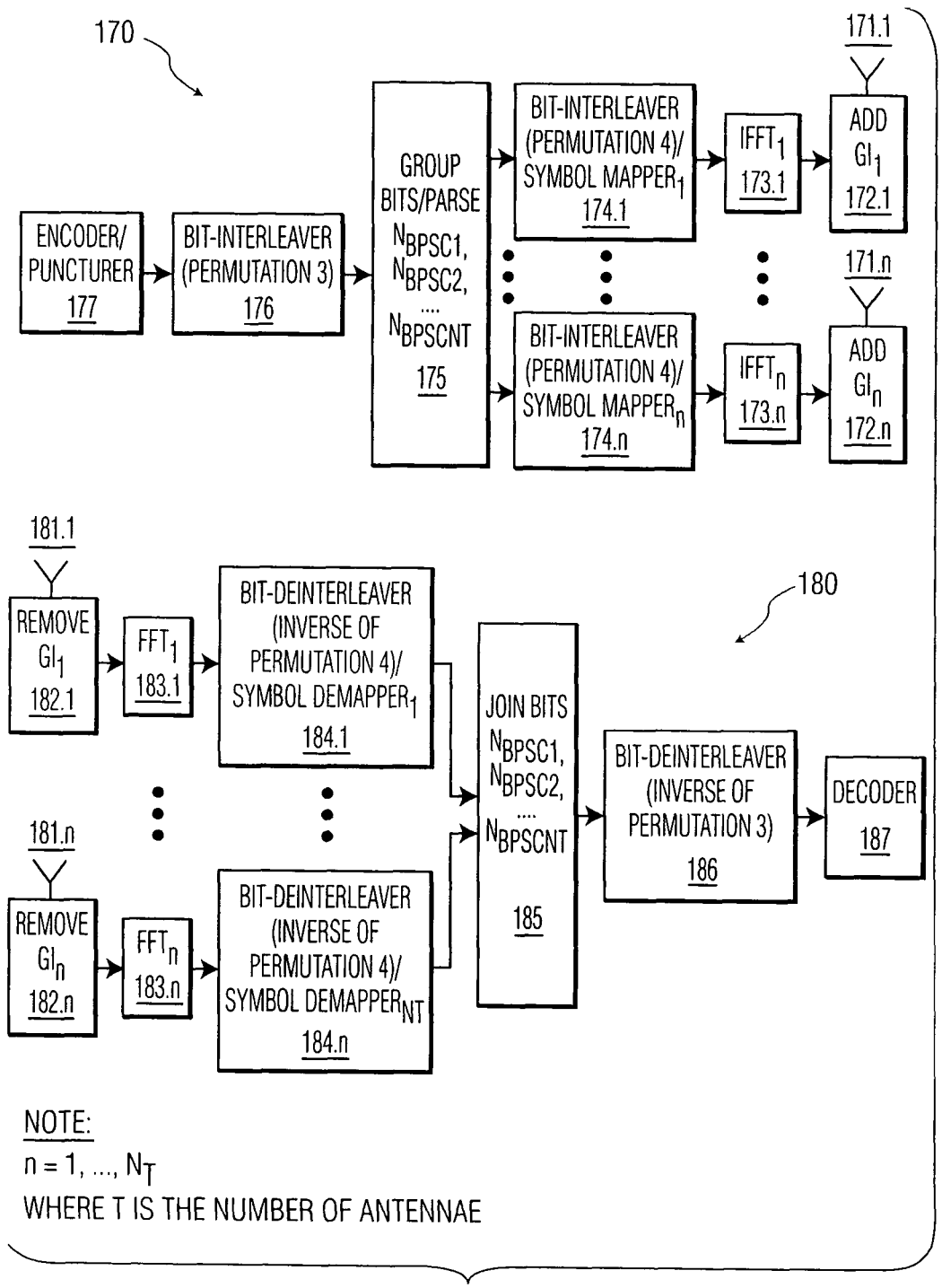
Figure 2A:
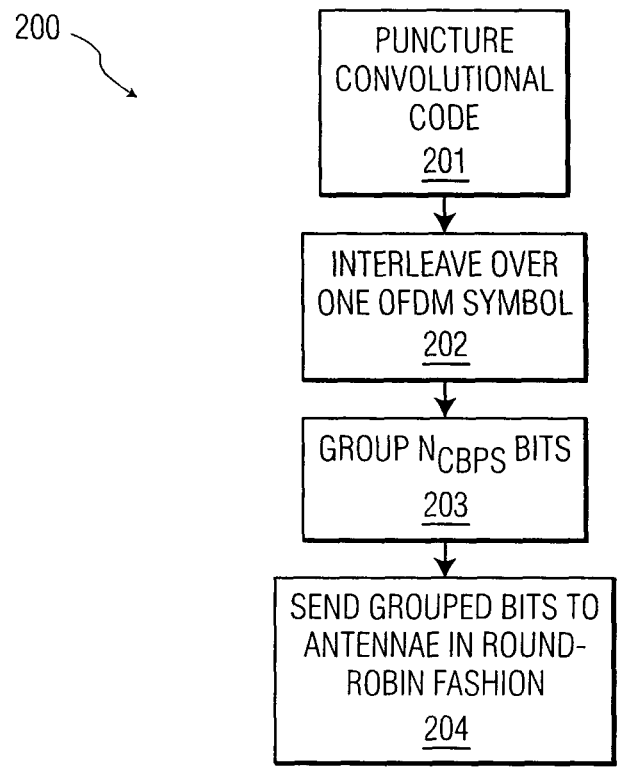
Figure 2B:
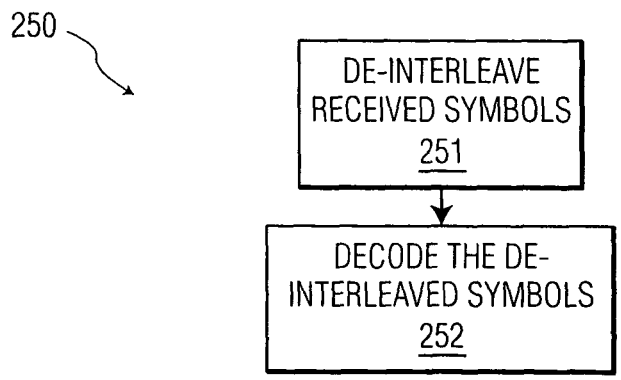
Figure 2C:
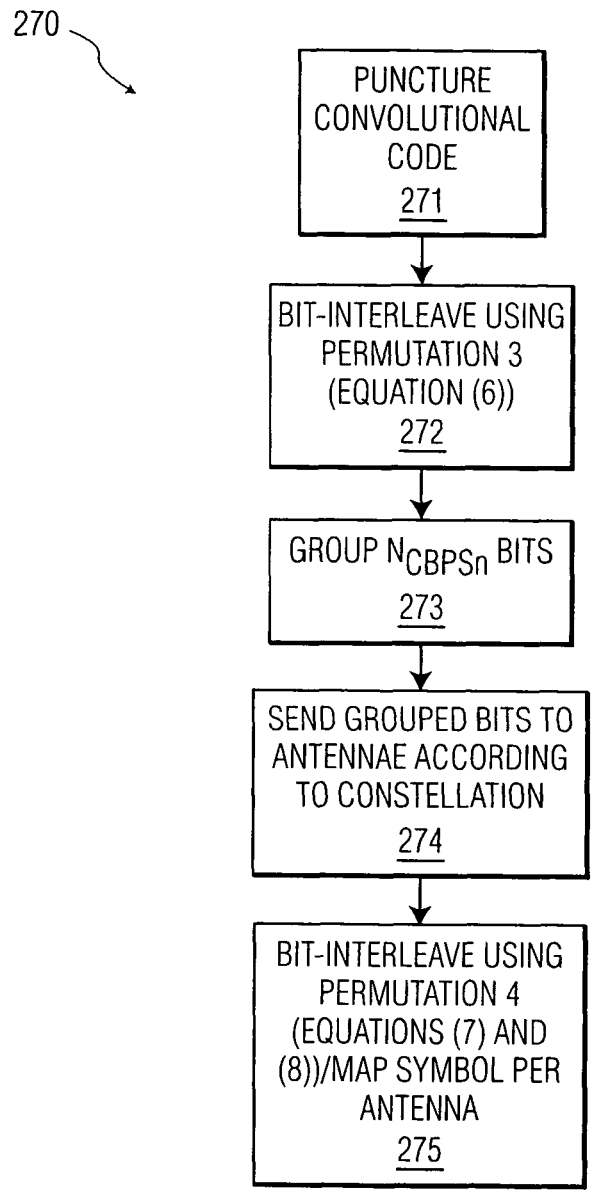
Figure 2D:
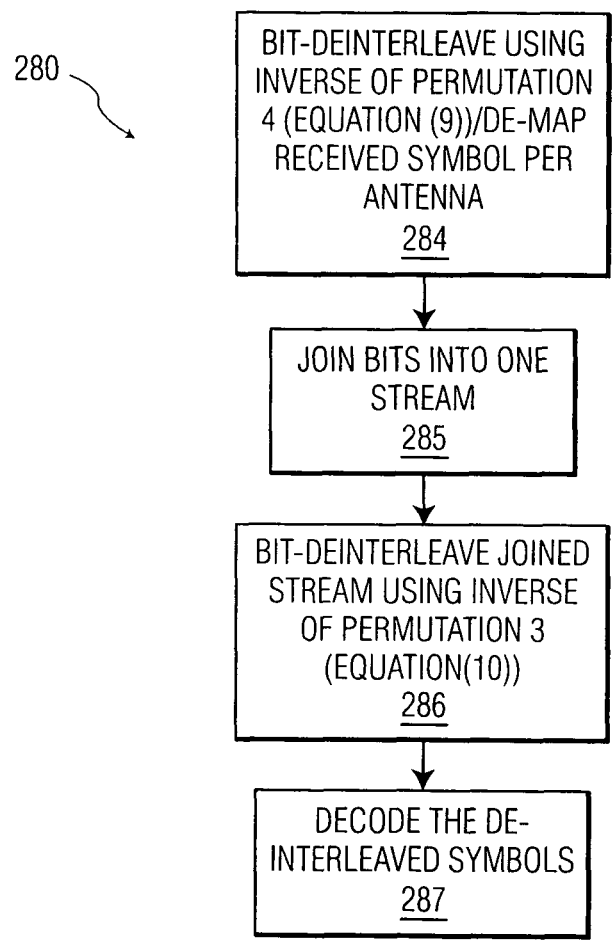
Figure 3:
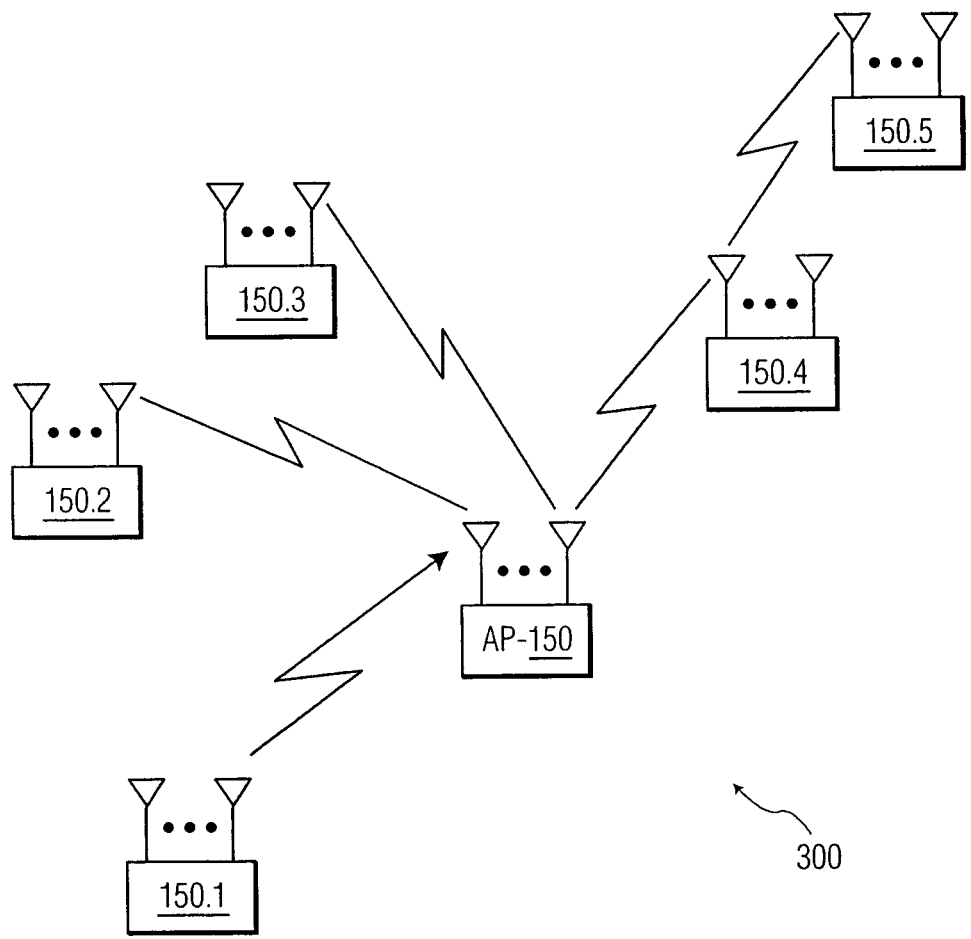
Figure 4:
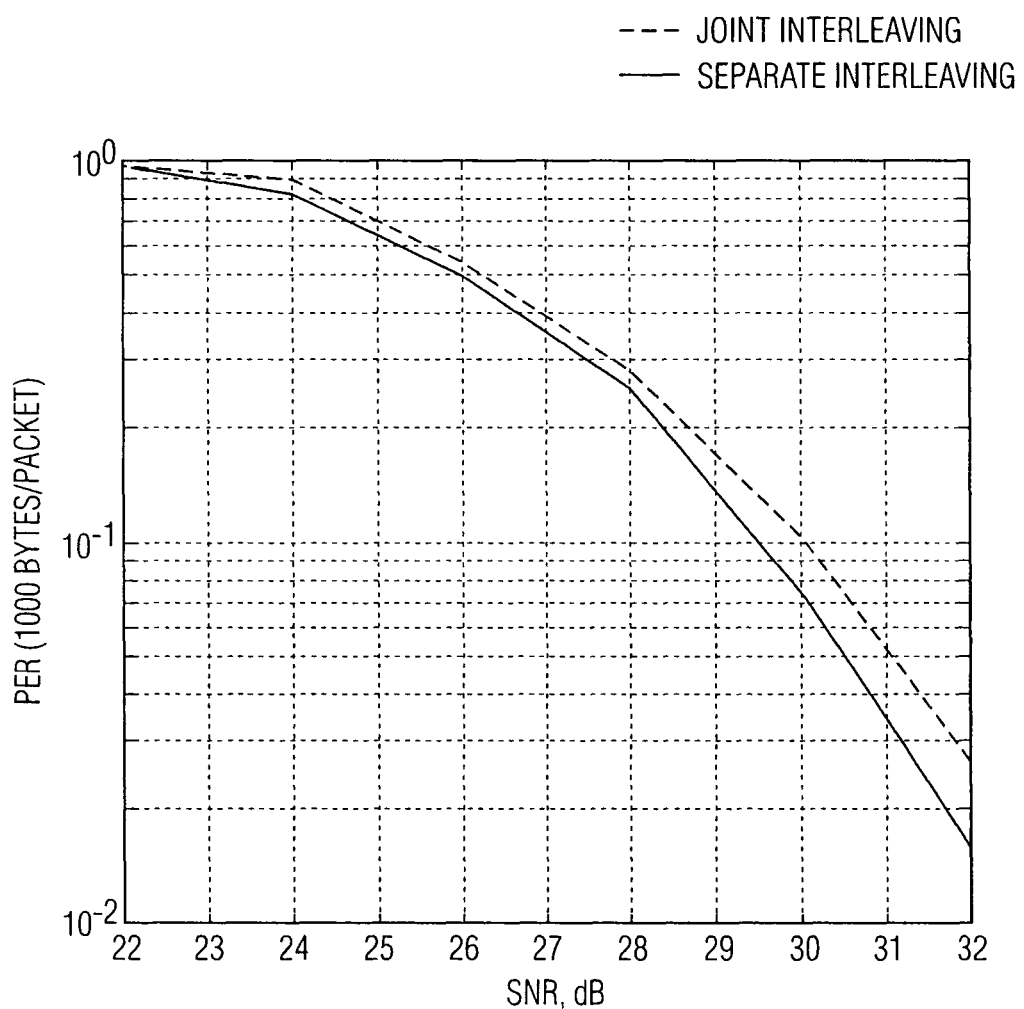

FIG. 1A illustrates a prior-art MIMO wireless device;
FIG. 1B illustrates a MIMO wireless device modified according to a first embodiment of the present invention;
FIG. 1C illustrates a MIMO wireless device modified according to a second embodiment of the present invention;
FIG. 2A illustrate a flow diagram of the transmitter side of the method of a first embodiment of the present invention;
FIG. 2B illustrates a flow diagram of the receiver side of the method of a first embodiment of the present invention;
FIG. 2C illustrates a flow diagram of the transmitter side of the method of a second embodiment of the present invention;
FIG. 2D illustrates a flow diagram of the receiver side of the method of a second embodiment of the present invention;
FIG. 3 illustrates a simplified block diagram of a wireless device in an ad-hoc wireless network system according to an embodiment of the present invention; and
FIG. 4 illustrates the performance of the first embodiment of the present invention compared to a system that interleaves separately over each antenna.

In the following description, by way of explanation, not limitation, specific details are set forth such as the particular architecture, interfaces, techniques, etc., in order to provide a thorough understanding of the present invention. However, it will be apparent to those skilled in the art that the present invention may be practiced in other embodiments that depart from these specific details.

The characteristics of a wireless channel typically vary over time. The error-coding scheme used must be adapted to the changing channel characteristics to achieve the best performance.

An encoder/decoder pair can change code rates using a technique termed "code puncturing" to adapt the code's error correction capabilities without changing their basic structure.

The encoder for a punctured code incorporates a bit selector that deletes specific code bits in accordance with a pre-determined puncturing rule. The original low-rate convolutional encoder is followed by the bit selector and is arranged so that only the bit selection rules need to be changed to generate different rates of codes at a transmitter side.

At a receiver side a Viterbi decoder decodes the punctured codes and only metrics need to be changed in accordance with the same pre-determined puncturing rule.

Interleaving addresses mitigating effects of burst errors. Frequency interleaving exploits the frequency diversity of wide-band transmissions. Time interleaving is not used in WLANs due to the slow-fading characteristics of the channel.

Interleaving amounts to interleaving symbols from at least two codewords before transmission. The error distribution is changed by relocating the bits of codewords so that a burst-error channel looks like a channel having only random errors.

Let m bet the interleaver depth, i.e., the number of codewords interleaved, and let N be the number of bits in a codeword. The data is written row-by-row into an m×N matrix, i.e., m codewords are written codeword-by-codeword into an array of m rows where each row is of length N (N columns). Then the data is read out column-by-column to send it over the channel. Between symbols of a given codeword there are m−1 symbols, one each from the other m−1 codewords. This approach requires that all interleaved data be received before they can be de-interleaved and is therefore slowed down by the interleaving/de-interleaving.

However, even given this somewhat slower approach, the system and method of the present invention provides a more robust transmission within wireless networks by improving the diversity seen by a convolutional decoder in a MIMO system.

In a first embodiment, the system and method of the present invention includes an apparatus comprising:
(1) a bit interleaver;
(2) a bit-to-symbol mapper; and (3) a parser that sends different symbols to different antennae.

The bit interleaver is used to interleave the output of the punctured convolutional code. In IEEE 802.11a, interleaving is done over one OFDM symbol, which has 48 data carriers. When 128-fft and multiple antennae are used, it is advantageous to interleave not only over the 96 data carriers in one OFDM symbol but over all 96*$N_t$ data carriers, where $N_t$ is the number of transmit streams. After interleaving, the bits are grouped $N_{BPSC}$ at a time, where $N_{BPSC}$ is the number of bits per symbol, e.g., 6 for 64 QAM. Each group of bits is then sent to a separate antenna in a round-robin fashion.

The interleaver is implemented in the following manner.

All encoded data bits are interleaved by a block interleaver with a block size corresponding to the number of bits in a single OFDM symbol, $N_{CBPS}$, multiplied by the number of transmitted streams $N_t$. The interleaver is defined by a two-step permutation:

(1) the first step of the permutation ensures that adjacent coded bits are mapped onto non-adjacent subcarriers on different antennae; and (2) the second step of the permutation ensures that adjacent coded bits are mapped alternately onto less and more significant bits of the constellation, and, thereby, long runs of low reliability (least significant bits or LSB) bits are avoided.

Let kk=number of columns in the interleaver;

k=index of the coded bit before the first permutation;

i=the index after the first and before the second permutation; and j=the index after the second permutation, just prior to modulation mapping.

In a preferred embodiment, the first permutation is defined by the rule:

$$i = N_T * \frac{N_{CBPS}}{kk}(k \bmod kk) + \text{floor}\left(\frac{k}{kk}\right), \quad (1)$$
$$k = 0, 1, \ldots, N_T * N_{CBPS} - 1$$

where floor(.) denotes the largest integer not exceeding the parameter.

The second permutation is defined by the rule:

$$j = s \times \text{floor}\left(\frac{i}{s}\right) + \left(i + N_T * N_{CBPS} - \text{floor}\left(kk \times \frac{i}{(N_T * N_{CBPS})}\right)\right) \bmod s, \quad (2)$$
$$i = 0, 1, \ldots, N_T * N_{CBPS} - 1.$$

The value of s is determined by the number of coded bits per subcarrier, $N_{BPSC}$, according to $$s = \max\left(\frac{N_{BPSC}}{2}, 1\right) \quad (3)$$

In this preferred embodiment, the deinterleaver, which performs the inverse transformation, is also defined by two permutations.

Let j=the index of the original received bit before the first permutation;

i=the index after the first and before the second permutation; and k=the index after the second permutation, just prior to delivering the coded bits to the convolutional (Viterbi) decoder.

The first permutation is defined by the rule:

$$i = \left(s \times \text{floor}\left(\frac{j}{s}\right) + \left(j + \text{floor}\left(kk \times \frac{j}{N_T * N_{CBPS}}\right)\right)\right) \bmod s, \quad (4)$$
$$j = 0, 1, \ldots, N_T * N_{CBPS} - 1$$

where s is defined in Equation (3). This permutation is the inverse of the permutation described in Equation (2).

The second permutation is defined by the rule:

$$k = kk \times i - \left((N_T * N_{CBPS} - 1) * \text{floor}\left(kk \times \frac{i}{(N_T * N_{CBPS})}\right)\right), \quad (5)$$
$$i = 0, 1, \ldots, N_T * N_{CBPS} - 1.$$

This permutation is the inverse of the permutation described in Equation (1). The parameter kk is chosen according to other parameters in the system. For example, simulation results have shown that for a 2×2 system using 64-fft, kk=32 gives the best performance, whereas for a 2×2, 128-fft system, kk-16 gives the best performance. In general, kk depends on the number of antennae and FFT size.

After interleaving, the bits are parsed as follows. The bits are grouped into groups of $N_{BPSC}$ bits corresponding to one constellation symbol. Each group is then sent to one antenna in a round-robin fashion. FIG. 4 illustrates that the interleaving method of the present invention performs almost 1 dB better than interleaving separately over each antenna.

A second embodiment, where the constellation on each antenna can be different (e.g., 64QAM on Antenna 1 and 16 QAM on Antenna 2), comprises the following steps:

(1) a bit interleaver according to permutation 3 below;

(2) grouping bits according to the desired constellation on each antenna (e.g., 6-bits for 64QAM, 4-bits for 16QAM);

(3) a parser sending each group of bits to the appropriate antenna according to the constellation on each antenna (e.g., in a two-antenna system comprising Antenna 1 and Antenna 2, 6-bit groups are sent to Antenna 1, and 4-bit groups are sent to Antenna 2); and (4) bit-interleaving among bits on each antenna using permutation 4 below, and then mapping to symbols.

Let $N_T$=number of antennae;

$N_{CPBSn}$=number of coded bits/OFDM symbols for nth antenna;

$N_{CPBS}=N_{CPBS1}+N_{CPBS2}\ldots+N_{CPBSNT}$=total number of coded bits/OFDM symbol;

$N_{BPSCn}$=number of bits/constellation symbols for nth antenna;

kk=number of columns.

Interleaver:

Permutation 3:

$$i = \frac{N_{CBPS}}{kk}(k \bmod kk) + \text{floor}\left(\frac{k}{kk}\right), \quad (6)$$
$$i = 0, 1, \ldots, N_{CBPS} - 1$$

Permutation 4 for nth antenna:

$$s_n = \max\left(\frac{N_{BPSC_n}}{2}, 1\right) \quad (7)$$

$$j = s_n \times \text{floor}\left(\frac{i}{s_n}\right) + \left(i + N_{CBPS_n} - \text{floor}\left(\frac{kk*i}{(N_{CBPS_n})}\right)\right) \bmod s_n, \quad (8)$$

$$i = 0, 1, \ldots N_{CBPS_n} - 1$$

Deinterleaver:
Permutation 5 for nth antenna is the inverse of permutation 4:

$$i = \left(s_n \times \text{floor}\left(\frac{j}{s_n}\right) + \left(j + \text{floor}\left(kk \times \frac{j}{N_{CBPS_n}}\right)\right)\right) \bmod s_n, \quad (9)$$

$$j = 0, 1, \ldots, N_{CBPS_n} - 1$$

Permutation 6 is the inverse of permutation 3:

$$k = kk \times i - \left((N_{CBPS} - 1) * \text{floor}\left(kk \times \frac{i}{N_{CBPS}}\right)\right), \quad (10)$$

$$i = 0, 1, \ldots, N_{CBPS} - 1$$

Referring now to FIG. 1A, a conventional MIMO wireless device 100 is shown that parses the 105 stream into n streams prior to interleaving by n interleavers 104.1-104.n for mapping by a plurality of mappers 103.1-103.n and transmission by a plurality of antennae 108.1-108.n, as contrasted with FIG. 1B which illustrates a MIMO wireless device 150 modified according to a first embodiment of the present invention which parses the 153 stream produced by a single interleaver 155. The device 150 comprises a transmitter side and a receiver 161, both of which are operatively coupled to a plurality of antennae 158.1-158.n. On the transmitter side, the device 150 comprises a convolutional encoder 157 that is operatively coupled to a bit selector/puncturer 156 (for puncturing the code) that is operatively coupled to an interleaver 155, which in turn is operatively coupled to a mapper 154. The interleaver 155 is a block interleaver defined by the two-step permutation of Equations (1) and (2). A parser 153 is arranged between the mapper 154 and the antennae 158.1-158.n to select an antenna in a round-robin fashion. On the receiver side the device 150 comprises a receiver 161 operatively coupled between the plurality of antennae 158.1-158.n and a deinterleaver 162 that performs the two-step inverse permutation defined by equations (4) and (5). The output of the deinterleaver is coupled to a Viturbi decoder 163.

Referring now to FIG. 1C, a MIMO device comprising a transmitter side 170 and a receiver side 180 modified according to a second embodiment of the present invention is illustrated. The receiver side 170 comprises a bit-interleaver that interleaves bits 176 according to permutation 3 and a grouper/parser 175 that the groups then bit according to a desired constellation on each antenna (e.g., 6-bits for 64QAM, 4-bits for 16QAM) and sends each group of bits to the appropriate antenna 171.1-171.n according to the constellation on each antenna (i.e., in a two-antenna system comprising Antenna 1 and Antenna 2, 6-bit groups are sent to Antenna 1, and 4-bit groups are sent to Antenna 2). A bit-interleaver 174.1-174.n interleaves among bits on each antenna using permutation 4, and then a symbol mapper 174.1-174.n maps to symbols. A receiver side 180 comprises a bit-deinterleaver/symbol-demapper 184.1-184.n for receiving a stream from each antenna 181.1-181.n to perform permutation 5 on each stream (inverse of permutation 4) and symbol demapping on each stream, coupled to a joiner 185 that joins the streams and is coupled to a bit-deinterleaver 186 and then performs permutation 6 (inverse of permutation 3) on the joined stream. The bit-deinterleaver 186 is coupled to a decoder 187 such that the output of the bit-deinterleaver 186 is sent to the decoder 187.

Referring now to FIG. 2A, a flow 200 of the transmitter side of the method of the first embodiment of the present invention is illustrated. At step 201 the convolutional code output by an encoder 106 is punctured by a bit selector 156 according to a pre-determined rule and then at step 202 the bits are interleaved by an interleaver 155 over one OFDM symbol. The interleaved bits are grouped into $N_{CBPS}$ at step 203, and at step 204 a parser 153 sends the grouped bits to an antenna of a plurality of antennae 157.1-157.n in a round-robin fashion.

Referring now to FIG. 2B, a flow 250 of the receiver side of the method of the present invention is illustrated. At step 251 the received signal is de-interleaved by a deinterleaver 162 that performs the inverse permutation steps of the interleaver 155 performed at step 202, and at step 252 the de-interleaved signal is decoded by a Viturbi decoder 163.

Referring now to FIG. 2C, a flow 270 of the transmitter side of the method of the second embodiment of the present invention is illustrated. At step 271 the convolutional code output by an encoder/puncturer 177 is bit-interleaved 272 using permutation 1 (equation (3)), and then at step 273 the interleaved bits are grouped into $N_{CBPS}$ bits and a parser 175 sends the grouped bits at step 274 for further processing according to the constellation of the appropriate antenna. At step 275, for each antenna's grouped bits, the bits are bit-interleaved using permutation 2 (equation (4)) and symbol-mapped by a bit-interleaver/symbol-mapper 174.1-174.n (for the n antennae).

Referring now to FIG. 2D, a flow 280 of the receiver side of the method of the second embodiment of present invention is illustrated. At step 284 the received signal is bit de-interleaved by a deinterleaver 162 that performs the inverse permutation (equation (5)) of permutation 1, the 'n' bit streams are joined at step 285, the joint stream is bit-deinterleaved using the inverse of permutation 1 (equation (6)) at step 286, and at step 287 the de-interleaved signal is decoded by a decoder 187.

Referring now to FIG. 3, the apparatus and method of the present invention can be used in any wireless multimedia transmission devices 150.i with a MIMO system 300, such as a wireless home network, and in MIMO systems for wireless multimedia transmission using IEEE 802.11a/g.

While the preferred embodiments of the present invention have been illustrated and described, it will be understood by those skilled in the art that various changes and modifications may be made, and equivalents may be substituted for elements thereof without departing from the true scope of the present invention. In addition, many modifications may be made to adapt to a particular situation, such as interleaver depth changes, and the teaching of the present invention can be adapted in ways that are equivalent without departing from its central scope. Therefore it is intended that the present invention not be limited to the particular embodiment disclosed as the best mode contemplated for carrying out the present invention, but that the present invention include all embodiments falling within the scope of the appended claims.

What is claimed is:

1. A wireless multiple-in-multiple-out (MIMO) apparatus, comprising:
   a block interleaver that interleaves an input-punctured convolutional bit stream and provides an interleaved output bit stream;

a bit-to-symbol mapper to group the interleaved output bit stream of the bit interleaver into output symbols;

a parser that sends each of the output symbols of the mapper to one of a plurality of antennae in a round-robin fashion; and a deinterleaver that performs the inverse transformation of the block interleaver on a bit stream transformed by the block interleaver.

2. The apparatus of claim 1, wherein the block interleaver further comprises a two-step permutation comprising a first and second step such that:

the first step of the permutation maps adjacent coded bits of the input-punctured convolutional bit stream onto non-adjacent subcarriers on different antennae of said plurality of antennae; and the second step of the permutation maps adjacent coded bits alternately onto less and more significant bits of a constellation.

3. The apparatus of claim 2, wherein the deinterleaver comprises an inverse transformation of the block interleaver mapping and comprises a third and fourth step such that the third step is the inverse of the first step and the fourth step is the inverse of the second step.

4. The apparatus of claim 1, wherein:

the wireless system is an IEEE 802.11a system;

the block interleaver has a block size corresponding to the number of bits $N_{CBPS}$ in an OFDM symbol multiplied by the number of transmitted streams $N_t$ and interleaves over one of all data carriers in an OFDM symbol and all transmit streams; and the mapper groups bits a pre-determined $N_{BPSC}$ bits at a time.

5. The apparatus of claim 4, wherein the block interleaver further comprises a two-step permutation comprising a first and second step such that:

the first step of the permutation maps adjacent coded bits of the input-punctured convolutional bit stream onto non-adjacent subcarriers on different antennae of said plurality of antennae; and the second step of the permutation maps adjacent coded bits alternately onto less and more significant bits of a constellation.

6. The apparatus of claim 5, wherein the deinterleaver further performs the inverse transformation of the block interleaver mapping and comprises a third and fourth step such that the third step is the inverse of the first step and the fourth step is the inverse of the second step.

7. A multiple-in-multiple-out (MIMO) wireless network of at least two devices comprising:

a transmitting side comprising:

a block interleaver that interleaves an input-punctured convolutional bit stream and provides an interleaved output bit stream;

a bit-to-symbol mapper to group the interleaved output bit stream of the bit interleaver into output symbols;

a parser that sends each of the output symbols of the mapper to one of a plurality of antennae in a round-robin fashion; and a receiving side comprising:

a deinterleaver that performs the inverse transformation of the block interleaver on a received bit stream transformed and transmitted by a device configured as is in the transmitting side.

* * * * *